United States Patent
Wright et al.

(10) Patent No.: US 10,565,324 B2
(45) Date of Patent: Feb. 18, 2020

(54) MANAGING A SET OF CANDIDATE SPATIAL ZONES ASSOCIATED WITH AN ARCHITECTURAL LAYOUT

(71) Applicant: MITEK HOLDINGS, INC., Wilmington, DE (US)

(72) Inventors: William A. Wright, Lexington, MA (US); Michael G. Shnitman, Newton, MA (US)

(73) Assignee: MITEK HOLDINGS, INC., Wilmington, DE (US)

( * ) Notice: Subject to any disclaimer, the term of this patent is extended or adjusted under 35 U.S.C. 154(b) by 133 days.

(21) Appl. No.: 15/219,391

(22) Filed: Jul. 26, 2016

(65) Prior Publication Data

US 2018/0032644 A1    Feb. 1, 2018

(51) Int. Cl.
*G06F 17/50* (2006.01)
*G06F 16/28* (2019.01)

(52) U.S. Cl.
CPC ........ *G06F 17/5004* (2013.01); *G06F 16/285* (2019.01)

(58) Field of Classification Search
CPC ...... G06F 17/50; G06F 17/30; G06F 17/5004; G06F 17/30598
USPC .......................................................... 703/1
See application file for complete search history.

(56) References Cited

U.S. PATENT DOCUMENTS

| | | | |
|---|---|---|---|
| 6,766,304 B2 | 7/2004 | Kemp, II et al. | |
| 6,772,132 B1 | 8/2004 | Kemp, II et al. | |
| 7,072,727 B1 | 7/2006 | Davis | |
| 7,499,839 B2 | 3/2009 | Massaro et al. | |
| 7,917,340 B2 | 3/2011 | Massaro et al. | |
| 8,994,726 B1 * | 3/2015 | Furukawa | G06T 17/10 345/420 |
| 2001/0037190 A1 | 11/2001 | Jung | |
| 2004/0239494 A1 | 12/2004 | Kennedy | |
| 2006/0008119 A1 | 1/2006 | Chang | |
| 2007/0198231 A1 | 8/2007 | Walch | |
| 2007/0219764 A1 | 9/2007 | Backe et al. | |
| 2008/0120068 A1 | 5/2008 | Martin et al. | |
| 2008/0120069 A1 * | 5/2008 | Martin | G06F 17/5004 703/1 |
| 2009/0271154 A1 | 10/2009 | Coad et al. | |
| 2011/0153524 A1 | 6/2011 | Schnackel | |
| 2011/0218777 A1 * | 9/2011 | Chen | G06F 17/50 703/1 |

(Continued)

OTHER PUBLICATIONS

Roche, James, How to Read a Floor Plan, Time to Build, <http://blog.houseplans.com/article/how-to-read-a-floor-plan>.
List of Wrightsoft Patents or Patent Applications Treated as Related.
Charles S. Barnaby, Mikhail Shnitman, William A. Wright, "HVAC System Design Automation: Issues, Methods, and Ultimate Limits" Seventh International IBPSA Conference, Aug. 13-15, 2001, pp. 1151-1158.

(Continued)

*Primary Examiner* — Andre Pierre Louis
*Assistant Examiner* — Faraj Ayoub
(74) *Attorney, Agent, or Firm* — Stinson LLP

(57) ABSTRACT

Disclosed aspects relate to managing a set of candidate spatial zones. The set of candidate spatial zones are associated with an architectural layout. A cluster of architectural segments is detected in a data source. The cluster of architectural segments represent a set of architectural features of the architectural layout. Based on the cluster of architectural segments, a set of junctures is identified. Using the set of junctures, a set of contours is determined. Based on the set of contours, the set of candidate spatial zones is generated.

16 Claims, 14 Drawing Sheets

(56) References Cited

U.S. PATENT DOCUMENTS

| | | | |
|---|---|---|---|
| 2012/0072181 A1 | 3/2012 | Imani | |
| 2012/0110595 A1 | 5/2012 | Reitman | |
| 2013/0066473 A1 | 3/2013 | Smith et al. | |
| 2013/0151013 A1 | 6/2013 | Nikovski et al. | |
| 2013/0261833 A1* | 10/2013 | Meghani | G06Q 50/06 700/297 |
| 2014/0039844 A1 | 2/2014 | Strelec et al. | |
| 2014/0039845 A1 | 2/2014 | K M et al. | |
| 2014/0320488 A1* | 10/2014 | Ege | G06T 17/05 345/420 |
| 2015/0046206 A1 | 2/2015 | Kelley | |
| 2015/0323394 A1 | 11/2015 | Alsaleem | |
| 2015/0347671 A1* | 12/2015 | Kiff | G06F 17/5004 703/7 |

OTHER PUBLICATIONS

User Manual IDA Indoor Climate and Energy, Versions 4.5 EQUA Simulation AB, Feb. 2013, pp. 1-179.

E. Subrahmanian; S. Rachuri; S. Fenves; R. Sriram; "Product lifecycle management support: A challenge in supporting product design and manufacturing in a networked economy" NIST National Institute of Standards and Technology, NISTIR 7211, Mar. 2005, 23 pages.

Andew J. Marsh; "Thermal Modelling: The ECOTECT Way" ISSN: 1833-7570; Issue No. 002, Aug. 1, 2006, 17 pages.

Robina Hetherington, Robin Laney, Stephen Peake; "Zone Modelling and Visualization: Keys to the Design of Low Crabon Buildings" May 1, 2012, 9 pages.

* cited by examiner

800

850

1000

1300

1400

US 10,565,324 B2

MANAGING A SET OF CANDIDATE SPATIAL ZONES ASSOCIATED WITH AN ARCHITECTURAL LAYOUT

BACKGROUND

This disclosure relates generally to computer systems and, more particularly, relates to management of data associated with an architectural layout. The amount of data that needs to be managed by enterprises is increasing. Management of data associated with architectural layouts may be desired to be performed as efficiently as possible. As data needing to be managed increases, the need for management efficiency may increase.

SUMMARY

Aspects of the disclosure use an input of an architectural layout having an array of wall portion-pieces to generate an output of one or more polytopes formed by wall lines. As such, actual room shapes may be extracted from an imprecise data source such as an imperfect drawing where walls include a line/arc of wall portion-pieces. Aspects may use pattern recognition techniques to transform an architectural layout of a building into a design-oriented representation of the building. As examples, utilizing aspects described herein, spatial zones for the building may be generated or a heating, ventilation, and air conditioning (HVAC) design-model may be established.

Aspects of the disclosure relate to managing a set of candidate spatial zones. The set of candidate spatial zones are associated with an architectural layout. A cluster of architectural segments is detected in a data source. The cluster of architectural segments represent a set of architectural features of the architectural layout. Based on the cluster of architectural segments, a set of junctures is identified. Using the set of junctures, a set of contours is determined. Based on the set of contours, the set of candidate spatial zones is generated.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
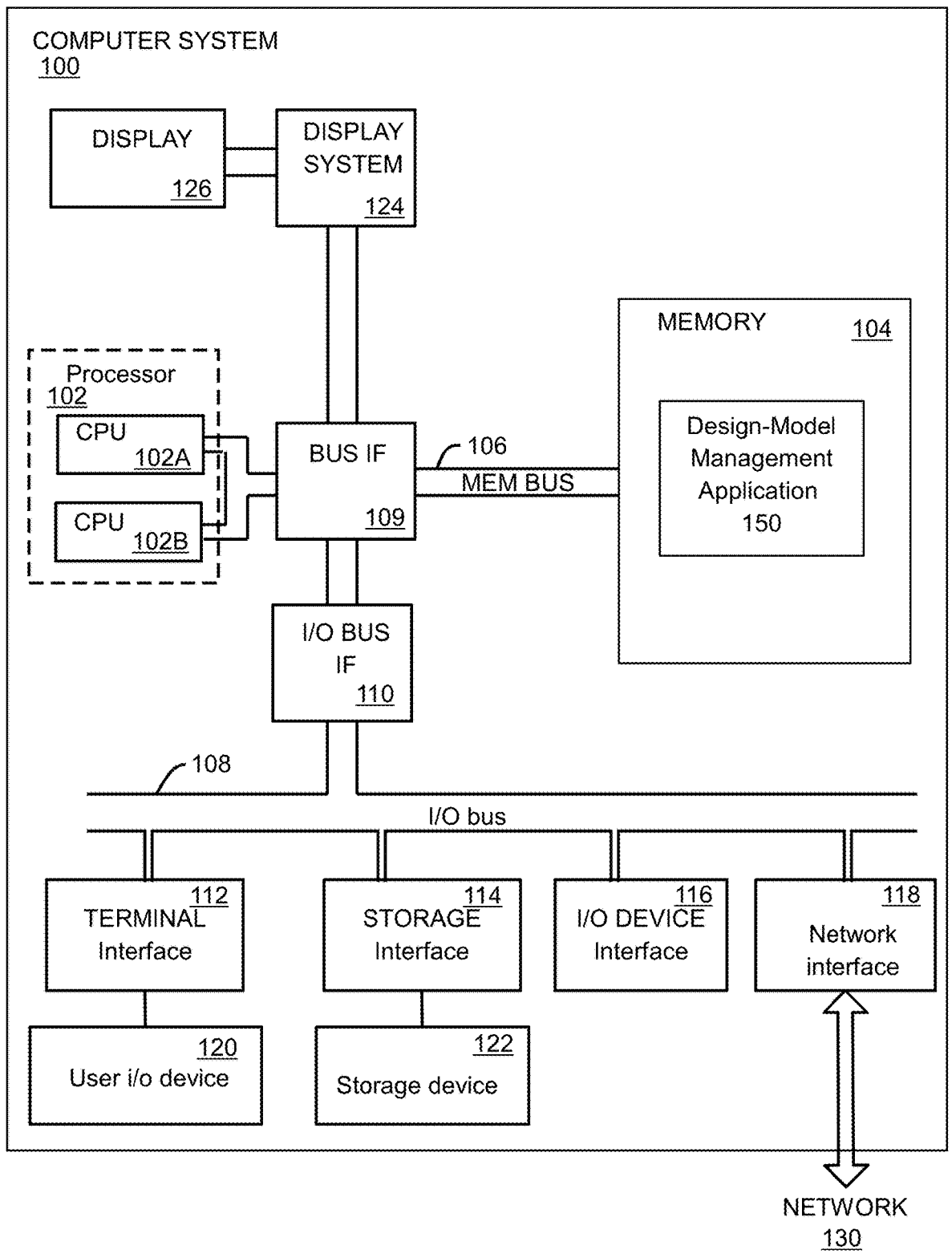
FIG. 1 depicts a high-level block diagram of a computer system for implementing various embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the disclosure use an input of an architectural layout having an array of wall portion-pieces to generate an output of one or more polytopes formed by wall lines (e.g., a polygon of lines for walls). As such, actual room shapes may be extracted from an imprecise data source such as an imperfect drawing (e.g., producing single-line rooms) where walls include a line/arc of wall portion-pieces. Aspects may use pattern recognition techniques to transform an architectural layout of a building into a design-oriented representation of the building. As examples, utilizing aspects described herein, spatial zones for the building may be generated or a heating, ventilation, and air conditioning (HVAC) design-model may be established.

Various types of data sources for architectural layouts of buildings exist. Different data sources can have distinct languages for their design. Deciphering particular languages can pose performance/efficiency challenges when, for example, attempting to compute components with respect to the building (e.g., energy distribution components). Geometrical computations which use features of floors, ceilings, interior walls, or exterior walls can be negatively impacted by a less-than-desirable translation of such features. For instance, outside surfaces of the building may be particularly consequential for thermal load calculations. As such, computations may be positively impacted by appropriately determining rooms/walls from one or more of the various types of data sources for architectural layouts of buildings.

Aspects of the disclosure include a method, system, and computer program product for managing a set of candidate spatial zones. The set of candidate spatial zones are associated with an architectural layout. A cluster of architectural segments is detected in a data source. The cluster of architectural segments represent a set of architectural features of the architectural layout. Based on the cluster of architectural segments, a set of junctures is identified (one or more junctures indicate a spatial interface relationship). Using the set of junctures, a set of contours is determined (one or more contours have a plurality of junctures including a start-finish juncture). Based on the set of contours, the set of candidate spatial zones is generated.

In embodiments, the cluster of architectural segments includes both a first wall segment and a second wall segment which each represent a (same) portion of a wall of the architectural layout. In certain embodiments, the first wall segment has both a threshold-proximity relationship and a threshold-parallel relationship with respect to the second wall segment. In various embodiments, the spatial interface relationship includes at least one of an intersection, a joint, or a neighborhood junction having a threshold tolerance dimension. The start-finish juncture may have one location where one contour both begins and ends.

In embodiments, identifying the set of junctures includes determining a bunch of geometric unions based on the cluster of architectural segments (one or more geometric unions may have both a portion of a first wall segment and a portion of a second wall segment). Based on the bunch of geometric unions, the set of junctures can be determined. In certain embodiments, determining the set of junctures includes determining a set of geometric segments based on the bunch of geometric unions (one or more geometric segments may include/use a boundary of at least a portion of the bunch of geometric unions). Based on the set of geometric segments, the set of junctures can be determined.

Aspects of the disclosure include a method, system, and computer program product for managing a group of geometric objects. The group of geometric objects is correlated to a set of spatial zones associated with an architectural layout. A set of contours is detected. The set of contours has a set of junctures (one or more contours have a plurality of junctures including a start-finish juncture). The set of junctures is based on a cluster of wall segments. The cluster of wall segments represent a set of walls of the architectural layout. Based on the cluster of wall segments, a set of wall edges is resolved. The set of wall edges interrelate with the set of contours. Based on the set of wall edges, the group of geometric objects is determined. The group of geometric objects represent the set of walls. Using the group of geometric objects, a design-model of the architectural layout is established.

In embodiments, determining the group of geometric objects includes determining a batch of candidate geometric objects based on the set of wall edges (one or more candidate geometric objects may include/use a boundary of at least a portion of a bunch of geometric unions). Based on the batch of candidate geometric objects, the group of geometric objects can be identified. In certain embodiments, identifying the group of geometric objects includes determining a group of juncture nodes based on the batch of candidate geometric objects (one or more juncture nodes may indicate a spatial interface relationship). Based on the group of juncture nodes, the group of geometric objects can be identified.

In embodiments, the start-finish juncture has one location where one contour both begins and ends. Determining the set of contours can include adding a new contour-portion which forms one or more new junctures. In embodiments, resolving the set of wall edges includes determining a bunch of geometric unions based on the cluster of wall segments (one or more geometric unions may have both a portion of a first wall segment and a portion of a second wall segment). Based on the bunch of geometric unions, the set of wall edges can be determined. Resolving the set of wall edges which interrelate with the set of contours can include mapping an individual polytope with respect to another polytope and determining an individual wall edge for the individual polytope based on the mapping.

In embodiments, determining/detecting the set of contours includes a set of operations (e.g., processing, stepping, computing). A first operation may process a segment-path to ascertain an individual contour. Processing the segment-path can include stepping along the segment-path from a first juncture to a second juncture to a third juncture and ultimately to the first juncture (e.g., without stepping again to the second juncture). In response to processing the segment-path, an individual polytope for the individual contour may be computed. In certain embodiments, determining/detecting the set of contours includes normalizing the set of contours (e.g., deleting a redundant piece, removing an appended piece, adding an implied piece, repairing a disconnected piece).

In various embodiments, the design-model includes a heating, ventilation, and air conditioning (HVAC) design-model. Aspects of the disclosure can include performance or efficiency benefits (e.g., speed, flexibility, responsiveness, resource usage) for managing (a group of geometric objects correlated to) a set of (candidate) spatial zones associated with an architectural layout. For example, resources such as bandwidth, processing, or memory may be saved (e.g., using a same memory space).

Turning now to the figures, FIG. 1 depicts a high-level block diagram of a computer system for implementing various embodiments of the present disclosure, consistent with various embodiments. The mechanisms and apparatus of the various embodiments disclosed herein apply equally to any appropriate computing system. The major components of the computer system 100 include one or more processors 102, a memory 104, a terminal interface 112, a storage interface 114, an I/O (Input/Output) device interface 116, and a network interface 118, all of which are communicatively coupled, directly or indirectly, for inter-component communication via a memory bus 106, an I/O bus 108, bus interface unit 109, and an I/O bus interface unit 110.

The computer system 100 may contain one or more general-purpose programmable central processing units (CPUs) 102A and 102B, herein generically referred to as the processor 102. In embodiments, the computer system 500 may contain multiple processors; however, in certain embodiments, the computer system 100 may alternatively be a single CPU system. Each processor 102 executes instructions stored in the memory 104 and may include one or more levels of on-board cache.

In embodiments, the memory 104 may include a random-access semiconductor memory, storage device, or storage medium (either volatile or non-volatile) for storing or encoding data and programs. In certain embodiments, the memory 104 represents the entire virtual memory of the computer system 100, and may also include the virtual memory of other computer systems coupled to the computer system 100 or connected via a network. The memory 104 can be conceptually viewed as a single monolithic entity, but in other embodiments the memory 104 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The memory 104 may store all or a portion of the various programs, modules and data structures for processing data transfers as discussed herein. For instance, the memory 104 can store a design-model management application 150. In embodiments, the design-model management application 150 may include instructions or statements that execute on the processor 102 or instructions or statements that are interpreted by instructions or statements that execute on the processor 102 to carry out the functions as further described below. In certain embodiments, the design-model management application 150 is implemented in hardware via semiconductor devices, chips, logical gates, circuits, circuit cards, and/or other physical hardware devices in lieu of, or in addition to, a processor-based system. In embodiments, the design-model management application 150 may include data in addition to instructions or statements.

The computer system 100 may include a bus interface unit 109 to handle communications among the processor 102, the memory 104, a display system 124, and the I/O bus interface unit 110. The I/O bus interface unit 110 may be coupled with the I/O bus 108 for transferring data to and from the various I/O units. The I/O bus interface unit 110 communicates with multiple I/O interface units 112, 114, 116, and 118, which are also known as I/O processors (IOPs) or I/O adapters (IOAs), through the I/O bus 108. The display system 124 may include a display controller, a display memory, or both. The display controller may provide video, audio, or both types of data to a display device 126. The display memory may be a dedicated memory for buffering video data. The display system 124 may be coupled with a display device 126, such as a standalone display screen, computer monitor, television, or a tablet or handheld device display. In one embodiment, the display device 126 may include one or more speakers for rendering audio. Alternatively, one or more speakers for rendering audio may be coupled with an I/O interface unit. In alternate embodiments, one or more of the functions provided by the display system 124 may be on board an integrated circuit that also includes the processor 102. In addition, one or more of the functions provided by the bus interface unit 109 may be on board an integrated circuit that also includes the processor 102.

The I/O interface units support communication with a variety of storage and I/O devices. For example, the terminal interface unit 112 supports the attachment of one or more user I/O devices 120, which may include user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 120 and the computer system 100, and may receive output data via the user output devices. For example, a user interface may be presented via the user I/O device 120, such as displayed on a display device, played via a speaker, or printed via a printer.

The storage interface 114 supports the attachment of one or more disk drives or direct access storage devices 122 (which are typically rotating magnetic disk drive storage devices, although they could alternatively be other storage devices, including arrays of disk drives configured to appear as a single large storage device to a host computer, or solid-state drives, such as flash memory). In some embodiments, the storage device 122 may be implemented via any type of secondary storage device. The contents of the memory 104, or any portion thereof, may be stored to and retrieved from the storage device 122 as needed. The I/O device interface 116 provides an interface to any of various other I/O devices or devices of other types, such as printers or fax machines. The network interface 118 provides one or more communication paths from the computer system 100 to other digital devices and computer systems; these communication paths may include, e.g., one or more networks 130.

Although the computer system 100 shown in FIG. 1 illustrates a particular bus structure providing a direct communication path among the processors 102, the memory 104, the bus interface 109, the display system 124, and the I/O bus interface unit 110, in alternative embodiments the computer system 100 may include different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface unit 110 and the I/O bus 108 are shown as single respective units, the computer system 100 may, in fact, contain multiple I/O bus interface units 110 and/or multiple I/O buses 108. While multiple I/O interface units are shown, which separate the I/O bus 108 from various communications paths running to the various I/O devices, in other embodiments, some or all of the I/O devices are connected directly to one or more system I/O buses.

In various embodiments, the computer system 100 is a multi-user mainframe computer system, a single-user system, or a server computer or similar device that has little or no direct user interface, but receives requests from other computer systems (clients). In other embodiments, the computer system 100 may be implemented as a desktop computer, portable computer, laptop or notebook computer, tablet computer, pocket computer, telephone, smart phone, or any other suitable type of electronic device.

FIG. 1 depicts several major components of the computer system 100. Individual components, however, may have greater complexity than represented in FIG. 1, components other than or in addition to those shown in FIG. 1 may be present, and the number, type, and configuration of such components may vary. Several particular examples of additional complexity or additional variations are disclosed herein; these are by way of example only and are not necessarily the only such variations. The various program components illustrated in FIG. 1 may be implemented, in various embodiments, in a number of different manners, including using various computer applications, routines, components, programs, objects, modules, data structures, etc., which may be referred to herein as "software," "computer programs," or simply "programs."

Figure 2:
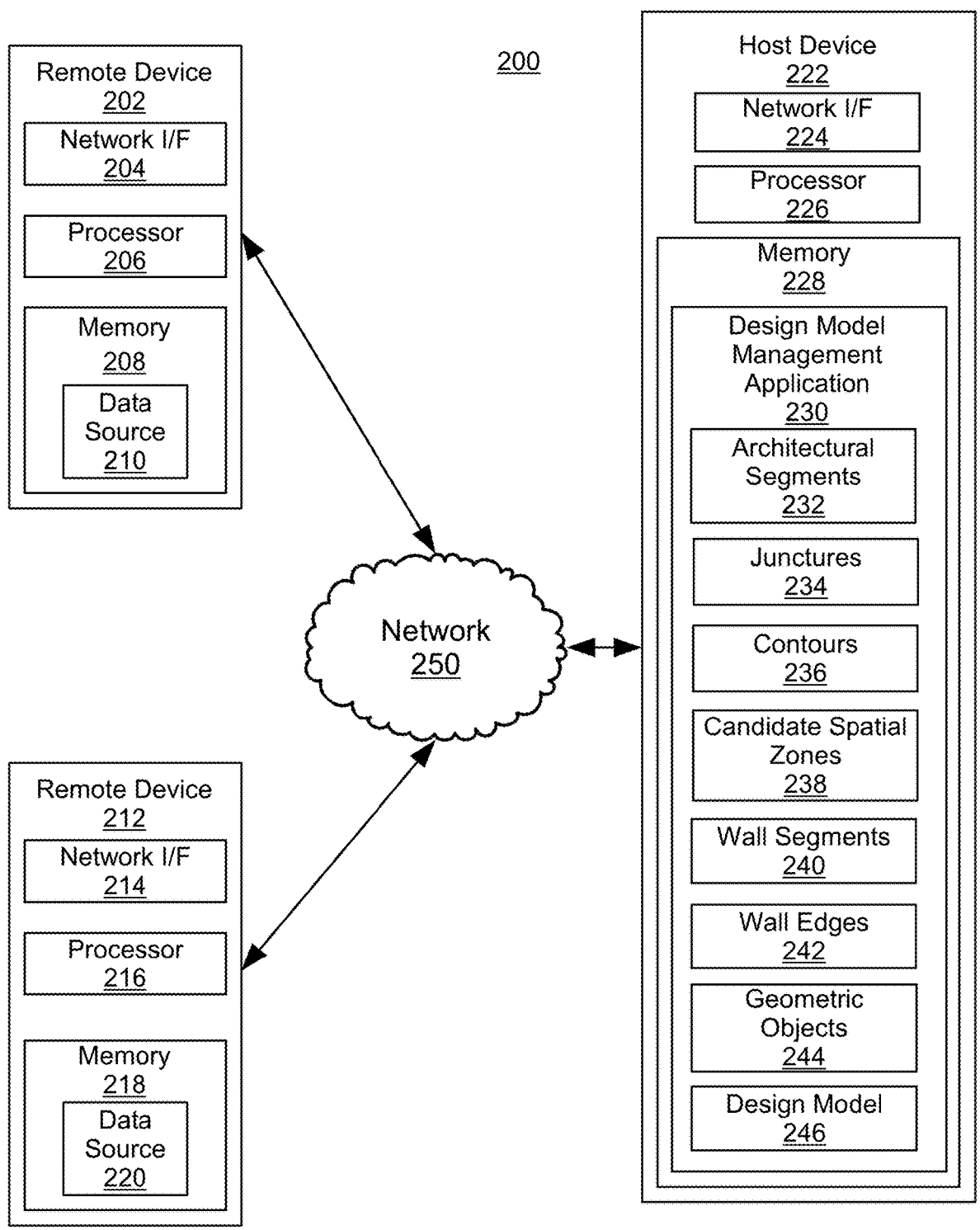
FIG. 2 is a diagrammatic illustration of an example computing environment according to embodiments.

FIG. 2 is a diagrammatic illustration of an example computing environment 200, consistent with embodiments of the present disclosure. In certain embodiments, the environment 200 can include one or more remote devices 202, 212 and one or more host devices 222. Remote devices 202, 212 and host device 222 may be distant from each other and communicate over a network 250 in which the host device 222 comprises a central hub from which remote devices 202, 212 can establish a communication connection. Alternatively, the host device and remote devices may be configured in any other suitable relationship (e.g., in a peer-to-peer or other relationship).

In certain embodiments the network 250 can be implemented by any number of any suitable communications media (e.g., wide area network (WAN), local area network (LAN), Internet, Intranet, etc.). Alternatively, remote devices 202, 212 and host devices 222 may be local to each other, and communicate via any appropriate local communication medium (e.g., local area network (LAN), hardwire, wireless link, Intranet, etc.). In certain embodiments, the network 250 can be implemented within a cloud computing environment, or using one or more cloud computing services. Consistent with various embodiments, a cloud computing environment can include a network-based, distributed data processing system that provides one or more cloud computing services. In certain embodiments, a cloud computing environment can include many computers, hundreds or thousands of them, disposed within one or more data centers and configured to share resources over the network.

Consistent with various embodiments, host device 222 and remote devices 202, 212 may be computer systems preferably equipped with a display or monitor. In certain embodiments, the computer systems may include at least one processor 206, 216, 226 memories 208, 218, 228 and/or internal or external network interface or communications devices 204, 214, 224 (e.g., modem, network cards, etc.), optional input devices (e.g., a keyboard, mouse, or other input device), and other commercially available and custom software (e.g., browser software, communications software, server software, natural language processing software, search engine and/or web crawling software, filter modules for filtering content based upon predefined criteria, etc.). In certain embodiments, the computer systems may include server, desktop, laptop, and hand-held devices.

In certain embodiments, remote devices 202, 212 may include a data source 210, 220. The data source 210, 220 may be a database, corpus, or other data storage system configured to communicate with the host device 222. The data source 210 may be configured to provide data/information (e.g., a set of architectural objects, architectural layout, building blueprints, PDF files, ACA files, structural photos) to the host device 222 for processing. As described herein, a design-model management application 230 of the host device 222 may be configured to manage (a group of geometric objects correlated to) a set of (candidate) spatial zones associated with an architectural layout.

The design model management application 230 may use data/information from one or more data sources such as data source 210 or data source 220. For example, an input having an array of wall portion-pieces can be processed to generate one or more polytopes formed by wall lines. As such, actual room shapes may be extracted from an imprecise data source such as an imperfect drawing (e.g., producing single-line rooms) where walls include a line/arc of wall portion-pieces. The design model management application 230 may have a set of operations. The set of operations can include an architectural segments operation 232, a junctures operation 234, a contours operation 236, a candidate spatial zones operation 238, a wall segments operation 240, a wall edges operation 242, a geometric objects operation 244, or a design model operation 246.

The architectural segments operation 232 detects a cluster of architectural segments in a data source (e.g., data source 210). The cluster of architectural segments represent a set of architectural features of an architectural layout. For example, the architectural segments operation 232 may extract an abstraction of a wall from a drawing (e.g., to be used in an algorithm described herein). For instance, relatively near/proximate/adjacent/neighboring objects (e.g., architectural segments) such as wall objects which are relatively parallel may be searched for. To illustrate, the search may be in a data source of various formats used for modeling or building design in multiple dimensions (e.g., 2-dimensional, 3-dimensional).

The junctures operation 234 identifies a set of junctures based on the cluster of architectural segments. One or more junctures may indicate a spatial interface relationship (e.g., intersection). A group of juncture defining operations may be utilized to identify the set of junctures. Unions (e.g., rectangular unions) may be formed based on the cluster of objects/architectural segments. The unions may be multi-wall structures created based on simple/single walls. The multi-walls may have one or more near/proximate/adjacent/neighboring relatively equitable length portions of simple walls (e.g., two effectively identical portions lying on top of each other or located less than 5% fractionally apart). Accordingly, a first room may neighbor with a second room along a set of multi-walls. Using multi-wall perimeters (e.g., tracing the perimeter), an array of line/arc portion-pieces may be created. The array of line/arc portion-pieces can be utilized in an efficient manner to determine zone/room boundaries. A juncture pool may be generated by searching for spatial interface relationships of the array of line/arc portion-pieces. The juncture pool can have a point at which a plurality of curves intersect. Altogether, information can be obtained as to which particular line/arc portion-pieces issue from a particular juncture and which group of junctures lie on a given line/arc portion-piece.

The contours operation 236 determines a set of contours using the set of junctures. One or more contours have a plurality of junctures including a start-finish juncture. Line/arc portion-pieces (e.g., curves) are walked/stepped along through junctures to determine/form/establish a contour (e.g., an elementary closed contour which cannot be broken into other closed contours). Line/arc portion-pieces can have a walk/step direction (e.g., clockwise, counterclockwise). As such, a certain contour which corresponds to a wall object itself may be excluded (and features that do not belong may be removed). Closed contours may be walked/stepped in one direction (e.g., for consistency in calculation).

In embodiments, the candidate spatial zones operation 238 generates a set of candidate spatial zones based on the set of contours. If a closed contour is found, it may be added to an array of candidate polytopes (to detect potential zone/room candidates). Contours may have been normalized (e.g., to assist in candidate spatial zone generation). Normalizing contours can include deleting redundant vertices or removing appendices such as partial walls. Accordingly, a set of potential room candidates may be detected/ascertained using the set of candidate spatial zones.

The wall segments operation 240 detects the set of contours having the set of junctures based on a cluster of wall segments which represent a set of walls of the architectural layout. For example, an outer designation or an inner designation may be determined for one or more multi-walls using one or more closed contours (e.g., multi-walls derived from closed contours). As such, multi-wall boundaries may be defined/decided (e.g., an outside boundary defined/decided).

The wall edges operation 242 resolves a set of wall edges based on the cluster of wall segments. The set of wall edges interrelate with the set of contours. The set of wall edges may be based on the outer designation or the inner designation, or similar information (e.g., 3-dimensional coordinates) with respect to the one or more multi-walls or the one or more closed contours. For example, a particular wall edge may be an outer perimeter of a particular multi-wall.

The geometric objects operation 244 determines the group of geometric objects based on the set of wall edges. The group of geometric objects represent the set of walls (e.g., as lines for walls). As such, one-line walls that touch each other may be computed. The group of geometric objects can be calculated to snap to a coordinate grid (e.g., according to a specified snap value). Positions of contour vertices may be reassigned/corrected in order to provide correspondence to intersections of neighboring wall lines (and in embodiments, consequentially, snap to coordinate grid nodes).

In embodiments, the design model operation 246 establishes a design-model of the architectural layout using the group of geometric objects. For example, the design-model may include one or more polytopes whose formation is based on the group of geometric objects. The design-model can include a virtual model. In certain embodiments, the design-model includes a heating, ventilation, and air conditioning (HVAC) design-model for an HVAC system proposed to be constructed in the building. Altogether, aspects of the design model management application 230 can include performance or efficiency benefits (e.g., speed for task completion, flexibility with respect to receiving various types of data/information, responsiveness of design-model production, resource usage to limit burdensome activities) for managing (a group of geometric objects correlated to) a set of (candidate) spatial zones associated with an architectural layout.

Figure 3:
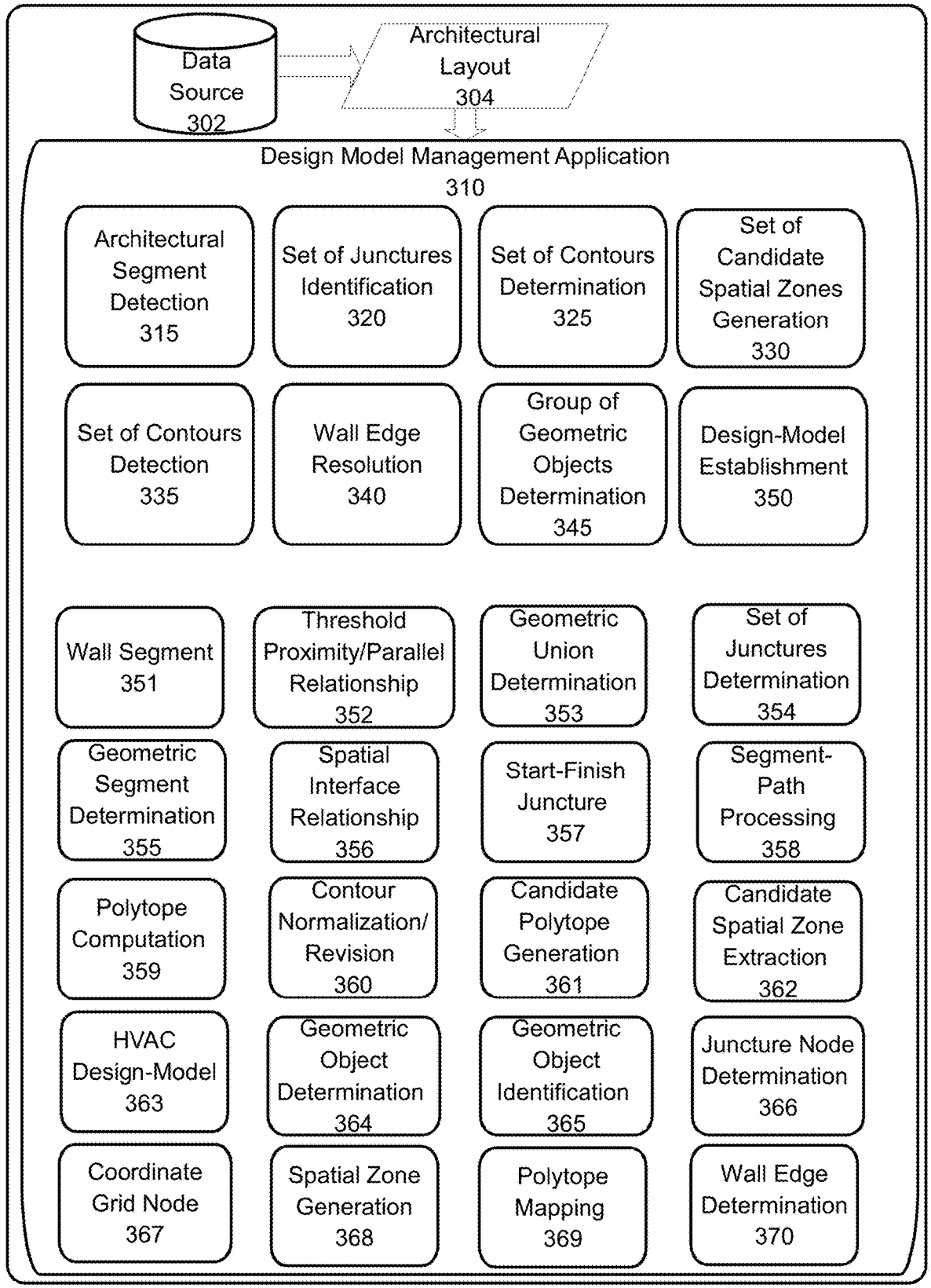
FIG. 3 is a block diagram illustrating a design-model management system according to embodiments.

FIG. 3 is a block diagram illustrating a design-model management system 300, consistent with various embodiments. The design-model management system 300 may include a number of sub-systems and modules configured to execute operations of a method for managing (a group of geometric objects correlated to) a set of (candidate) spatial zones associated with an architectural layout. As shown in FIG. 3, the design-model management system 300 may include a data source 302, an architectural layout 304, and a design model management application 310. Aspects of FIG. 3 may be similar or the same as other aspects described herein; for example, aspects related to FIG. 2. Other systems, modules, and operations in keeping with the scope and spirit of the disclosure are also possible.

The data source 302 may include electronic and non-electronic mediums including blueprints, floor plans, raw files, digital files (e.g., ACA files, image files, PDF files, scanned documents), aerial/satellite images, photographs, and other means of data storage. Put differently, the data source 302 may include the medium or means of conveying the architectural layout (e.g., digital file, hand-drawn blueprint), while the architectural layout may include the data (e.g., lines, shapes, symbols) that make up the graphical representation of the building and its architecture. As described herein, the building may be modeled using include two-dimensional, three-dimensional, or other multi-dimensional objects, data structures, or images. Data sources other than those mentioned explicitly herein are also possible. Generally, the architectural layout 304 may include a plan or design that depicts the structural arrangement and physical characteristics of a building. For instance, the architectural layout 304 may include a two-dimensional or three-dimensional diagram of the structural arrangement of a residential building (e.g., house), commercial building (e.g., office building, retail store), industrial building (e.g., factory) or other physical structures (arenas, parking ramps, swimming pools, space stations).

The architectural segment detection module 315 detects a cluster of architectural segments in the data source 302. The cluster of architectural segments represent a set of architectural features of the architectural layout 304. The architectural layout 304 may be populated by the cluster of architectural segments (e.g., a cluster of lines/arcs/curve-segments for walls). The cluster of architectural segments detected/sensed may include symbols, markings, shapes, characters, text, or other elements that designate, annotate, or otherwise call out particular aspects of the architectural layout 304 (e.g., a wall). For instance, the cluster of architectural segments may include a diagonal line to indicate a door, a thick line to indicate a wall, an elongated rectangle to indicate a window, and the like. The cluster of architectural segments may represent, symbolize or indicate a set of architectural features of the building or structure depicted by the architectural layout 304. As examples, the architectural features may include doors, windows, walls, stairs, appliances, furnishings, and other physical characteristics of the building or structure.

In embodiments, a wall segment module 351 indicates that the cluster of architectural segments includes both a first wall segment and a second wall segment which each represent a (same) portion of a wall of the architectural layout. In general, the wall segment module 351 indicates a flaw with respect to the cluster of architectural segments. For instance, the drawings having the first and second wall segments may be flawed by having two lines for a wall when the intent was one line for a wall (e.g., the drafter drew two separate lines which overlap/are—offset instead of one continuous line). Having such a line cluster can deter accurate/precise computations/calculations with respect to the architectural layout.

In embodiments, a threshold proximity/parallel relationship module 352 indicates that the first wall segment has at least one of a threshold-proximity relationship or a threshold-parallel relationship with respect to the second wall segment. The threshold-proximity relationship can include the first and second wall segments being near/close to each other relative to the scale of the drawing. The threshold-parallel relationship can include the first and second wall segments being relatively parallel (e.g., angled within 2%, 5%, 10%) to each other. For instance, consider a three-dimensional drawing of a house that appears to have two exterior walls of ordinary thickness in almost the same location with approximately a two-inch gap in between the two exterior walls (one at an angle of 178 degrees and the other at 180 degrees). The same wall may have been drawn twice, or copied and slightly moved. As such, the drawing may be flawed. However, the threshold proximity/parallel relationship module 352 can indicate the irregularity (e.g., having double exterior walls).

The set of junctures identification module 320 identifies a set of junctures based on the cluster of architectural segments. One or more junctures may indicate a spatial interface relationship (e.g., spot at which two or more curves effectively intersect). In embodiments, the spatial interface relationship module 356 indicates that the spatial interface relationship exists. The spatial interface relationship may be an association, dependency, or contingency that designates the dimensional interaction between one or more architectural segments of the architectural layout. The spatial interface relationship can include a connection, a tangent point, an intersection, a joint, or a neighborhood junction having a threshold tolerance dimension. For example, the intersection may include a crossroads (e.g., "+", "X") in middles of two segments in a two-dimensional drawing (or similar in a three-dimensional drawing). The joint may include a touchpoint of an ending of a first segment in the middle of a second segment (e.g., "T") or a two endings touchpoint (e.g., "L") such as a corner. The neighborhood junction may be without a touchpoint of two segments, but at least one endpoint of at least one of the two segments may be very near to the other segment to indicate a juncture (e.g., "V", "|–", "_/"). The threshold tolerance dimension may include a proportion of the architectural layout 304 size/scaling (e.g., a separation distance within 1% or 5% of the size of the architectural layout).

In embodiments, identifying the set of junctures includes determining a bunch of geometric unions by a geometric union determination module 353. The bunch of geometric unions (e.g., resulting multi-walls) may be based on the cluster of architectural segments (e.g., input simple/single walls). One or more geometric unions may have both a portion of a first wall segment and a portion of a second wall segment. For example, if the first and second wall segments are parallel, perpendicular lines may be computed/drawn from the first wall segment to the second wall segment to form the bunch of geometric unions (e.g., rectangular areas between perpendicular and parallel lines, or equivalent). Based on the bunch of geometric unions, the set of junctures can be determined (e.g., two/three-dimensional coordinates having overlapping geometric unions) by a set of junctures determination module 354.

In certain embodiments, determining the set of junctures includes determining a set of geometric segments by a geometric segment determination module 355. The set of geometric segments (e.g., line segments of the resulting multi-walls) may be based on the bunch of geometric unions. One or more geometric segments may include/use a boundary of at least a portion of the bunch of geometric unions. Other possibilities are also contemplated such as bisecting the bunch of geometric unions, or similar. Based on the set of geometric segments (e.g., newly computed/drawn lines/arcs/curves), the set of junctures can be determined (e.g., intersections of the geometric segments) by the set of junctures determination module 354.

The set of contours determination module 325 determines a set of contours (e.g., at least one curve/polyline) using the set of junctures. A contour may be a type of curve in the complex plane or can provide a precise definition of the curves on which an integral may be suitably defined. One or more contours have a plurality of junctures including a start-finish juncture (e.g., curve starts and finishes at same spot, one location where one contour both begins and ends) which can be indicated by a start-finish juncture module 357.

In various embodiments, the set of contours determination module 325 may add a new contour-portion which forms one or more new junctures. For example, consider a room which is 12 feet by 30 feet. For design/operational purposes, a user may desire treat this 'long room' as two smaller rectangular rooms. As such, the room may be divided into two rooms (e.g., 2 at 12'×15', 1 at 12'×12' and 1 at 12'×18'). Such division could be based on the junctures that were already there (e.g., by bisecting, by an algorithm which proportions matters, by an algorithm that determines energy distribution efficiencies).

In embodiments, a segment-path processing module 358 determines the set of contours utilizing a set of operations (e.g., processing, stepping, computing). A first operation may process a segment-path to ascertain an individual contour. Processing the segment-path can include: stepping along the segment-path from a first juncture to a second juncture (which is separate from the first juncture), stepping along the segment-path from the second juncture to a third juncture (which is separate from the first and second junctures), and stepping along the segment-path to the first juncture from a juncture other than the second juncture. The stepping may occur in one direction (e.g., not repeating junctures). In response to processing the segment-path, an individual polytope for the individual contour may be computed by a polytope computation module 359. The individual polytope may be without an intersection/crossover point with respect to itself. Subsequently, the individual polytope may be displayed/presented to a user.

In certain embodiments, determining the set of contours includes using a contour normalization/revision module 360 to normalize or revise the set of contours. A redundant piece may be deleted (e.g., delete redundant vertex). An appended piece can be removed (e.g., remove pieces/lines or appendages/appendices which extend past intersections/junctures but should not). A disconnected piece can be repaired (e.g., extending pieces/lines which do not reach where they should for an intersection). An implied piece may be added (e.g., add a segment to close a contour to draw in a wall may allow for a space to be treated separately for an architectural/energy/thermal distribution purpose such as the architectural layout being without interior doors and possibly thereby having incomplete/disconnected contours).

In embodiments, the set of candidate spatial zones generation module 330 generates a set of candidate spatial zones (e.g., candidate rooms) based on the set of contours. The candidate spatial zones may include two-dimensional, three-dimensional, or multi-dimensional potential zones (e.g., regions, rooms, areas, portions of space of a building/structure) to be treated/utilized in a particular manner. For example, painting a particular zone a particular color or facilitating energy distribution in a first manner to a first zone and in a second manner to a second zone. In certain embodiments, the set of candidate spatial zones may be considered for potential merging or combination with one another as part of establishing the design-model of the architectural layout. In embodiments, a candidate polytope generation module 361 generates a set of candidate polytopes. The set of candidate polytopes may be displayed/presented to a user. The user may select among those presented for quality-control purposes. Altogether, the set of candidate spatial zones may be extracted (e.g., pulled-out, drawn-out, deciphered) from the architectural layout using a candidate spatial zone extraction module 362.

The set of contours detection module 335 detects, senses, collects, or gathers the set of contours having the set of junctures based on a cluster of wall segments which represent a set of walls of the architectural layout. In embodiments, the set of contours detection module 335 communicates with the segment-path processing module 358 to detect the set of contours utilizing a set of operations (e.g., processing, stepping, computing) described herein. In response to processing the segment-path by the segment-path processing module 358, an individual polytope for the individual contour may be computed by the polytope computation module 359 as described herein. In certain embodiments, detecting the set of contours includes using the contour normalization/revision module 360 described herein. Other aspects/modules described herein (e.g., the set of contours determination module 325) are contemplated to be utilized by the set of contours detection module 335.

The wall edge resolution module 340 resolves/determines/ascertains a set of wall edges (e.g., a set of polytopes) based on the cluster of wall segments. The set of wall edges (e.g., outer/inner sides of multi-walls) interrelate with the set of contours (e.g., the multi-walls were derived from the set of contours). In embodiments, resolving the set of wall edges includes determining a bunch of geometric unions (e.g., multi-walls) based on the cluster of wall segments. One or more geometric unions may have both a portion of a first wall segment and a portion of a second wall segment. Based on the bunch of geometric unions, the set of wall edges can be determined by the wall edge determination module 370. Resolving the set of wall edges which interrelate with the set of contours can include mapping an individual polytope (e.g., outer/inner wall lines of a first room) with respect to another polytope (e.g., outer/inner wall lines of a second room) by the polytope mapping module 369 (e.g., polytope formation based on coordinate relationships of polytopes) and using the wall edge determination module 370 to determine an individual wall edge (e.g., the line for a wall to be used for the design-model) for the individual polytope based on the mapping.

The group of geometric objects determination module 345 determines the group of geometric objects (e.g., a group of polytopes) based on the set of wall edges. The group of geometric objects represent the set of walls (e.g., as lines for walls). In various embodiments, the group of geometric objects snap to a coordinate grid node according to a snap value utilizing a coordinate grid node module 367 (e.g., for performance/efficiency benefits in managing the group of geometric objects as described herein). In embodiments, determining the group of geometric objects includes a geometric object determination module 364 determining a batch of candidate geometric objects (e.g., one or more possible lines for walls) based on the set of wall edges. One or more candidate geometric objects may include/use a boundary of at least a portion of a bunch of geometric unions (e.g., multi-wall outers/inners). Based on the batch of candidate geometric objects, the group of geometric objects can be identified by a geometric object identification module 365.

In certain embodiments, identifying the group of geometric objects includes a juncture node determination module 366 determining a group of juncture nodes (e.g., beginning/end points/spots for one or more possible wall lines/faces). The group of juncture nodes may be determined based on the batch of candidate geometric objects. One or more juncture nodes may indicate a spatial interface relationship. Based on the group of juncture nodes, the group of geometric objects can be identified by the geometric object identification module 365.

In embodiments, the design-model establishment module 350 establishes a design-model of the architectural layout using the group of geometric objects (or the set of candidate spatial zones). Based on the group of geometric objects, the set of spatial zones may be generated by a spatial zone generation module 368. Based on the generated set of spatial zones, the design-model can be established. In certain embodiments, the design-model includes a heating, ventilation, and air conditioning (HVAC) design-model for an HVAC system proposed to be constructed in the building which may be developed using an HVAC design-model module 363. Altogether, the set of spatial zones may be extracted (e.g., pulled-out, drawn-out, deciphered) from the architectural layout using the candidate spatial zone extraction module 362. For instance, the group of geometric objects can be used as lines for rooms in a floor plan or surfaces with respect to rooms in a three-dimensional model.

Figure 4:
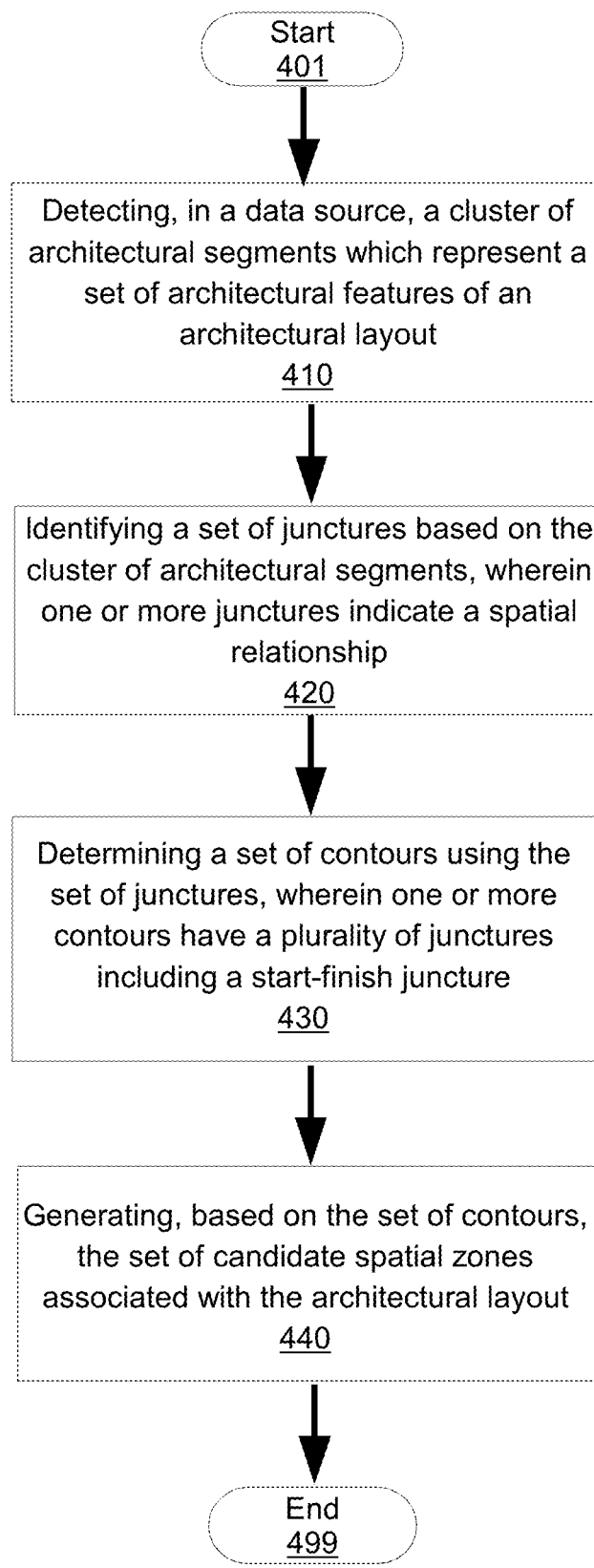
FIG. 4 is a flowchart illustrating a method for managing a set of candidate spatial zones associated with an architectural layout according to embodiments.

FIG. 4 is a flowchart illustrating a method 400 for managing a set of candidate spatial zones associated with an architectural layout according to embodiments. Method 400 may begin at block 401. At block 410, a cluster of architectural segments is detected in a data source. The cluster of architectural segments represent a set of architectural features of the architectural layout. At block 420, based on the cluster of architectural segments, a set of junctures is identified (one or more junctures indicate a spatial interface relationship). At block 430, using the set of junctures, a set of contours is determined (one or more contours have a plurality of junctures including a start-finish juncture). At block 440, based on the set of contours, the set of candidate spatial zones is generated.

In embodiments, the operational steps such as the detecting, the identifying, the determining, and the generating each occur in an automated fashion without user intervention or manual action (e.g., using automated computing machinery, fully machine-driven without manual stimuli). The automated operational steps may be performed by a design-model management engine (e.g., as part of an HVAC design management system). Method 400 concludes at block 499. Aspects of method 400 may provide performance or efficiency benefits (e.g., speed, flexibility, responsiveness, resource usage) with respect to managing a set of candidate spatial zones.

For example, consider a three-dimensional layout of a residential building. Walls, which divide-up the residential building into rooms, may be represented by rectangular parallelepipeds. Interface spots/locations of a plurality of rectangular parallelepipeds can be identified (e.g., corners where the walls meet). Using the interface spots/locations, contours (e.g., for polytopes such as boxes) are determined. Based on the contours, one or more candidate rooms are created. The candidate rooms can then be used to establish a design-model for constructing a heating, ventilation, and air conditioning (HVAC) system. As such, the design-model may be used to select an HVAC system with performance or efficiency benefits (e.g., with respect to energy distribution).

Figure 5:
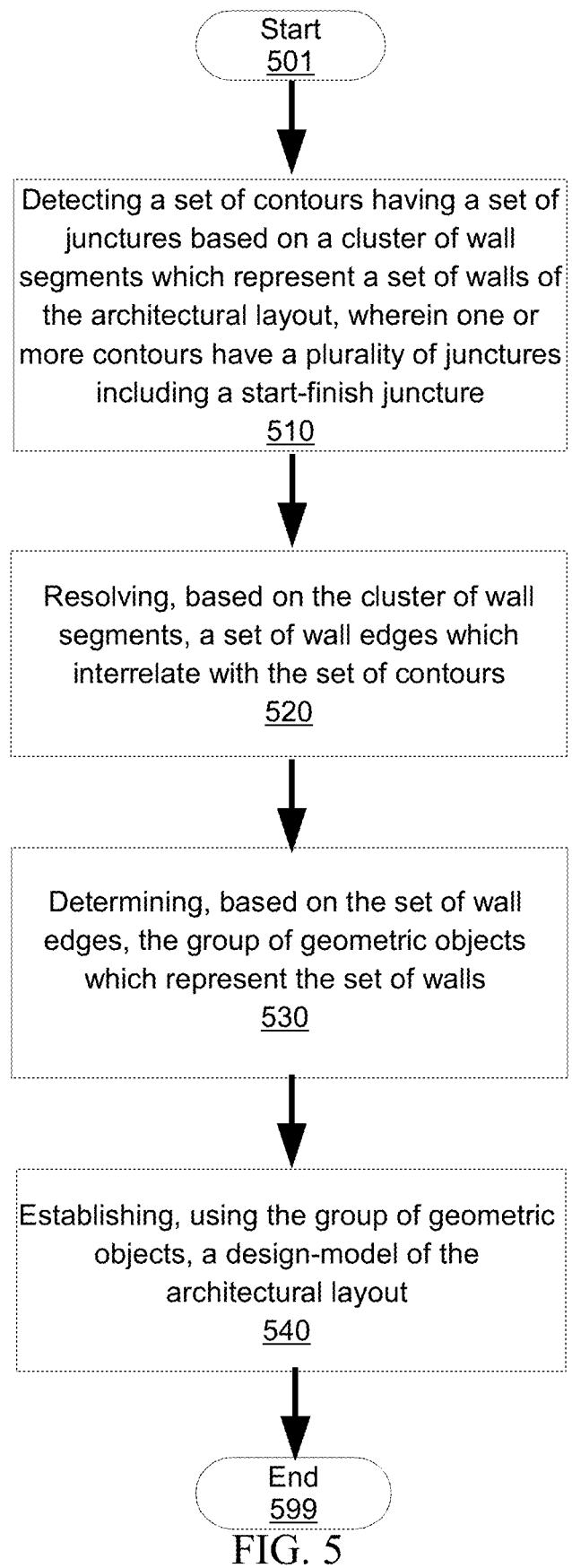
FIG. 5 is a flowchart illustrating a method for managing a group of geometric objects correlated to a set of spatial zones associated with an architectural layout according to embodiments.

FIG. 5 is a flowchart illustrating a method 500 for managing a group of geometric objects correlated to a set of spatial zones associated with an architectural layout according to embodiments. Method 500 may begin at block 501. At block 510, a set of contours is detected. The set of contours has a set of junctures (one or more contours have a plurality of junctures including a start-finish juncture). The set of junctures is based on a cluster of wall segments. The cluster of wall segments represent a set of walls of the architectural layout. At block 520, a set of wall edges is resolved based on the cluster of wall segments. The set of wall edges interrelate with the set of contours. At block 530, the group of geometric objects is determined based on the set of wall edges. The group of geometric objects represent the set of walls. At block 540, a design-model of the architectural layout is established using the group of geometric objects.

In embodiments, the operational steps such as the detecting, the resolving, the determining, and the establishing each occur in an automated fashion without user intervention or manual action (e.g., using automated computing machinery, fully machine-driven without manual stimuli). The automated operational steps may be performed by a design-model management engine (e.g., as part of an HVAC design management system). Method 500 concludes at block 599. Aspects of method 500 may provide performance or efficiency benefits (e.g., speed, flexibility, responsiveness, resource usage) with respect to managing a group of geometric objects.

For example, consider a three-dimensional layout of a residential building (e.g., as discussed as an example with respect to FIG. 4). Walls, which divide-up the residential building into rooms, may be represented by rectangular parallelepipeds. Contours (e.g., polytopes such as boxes) derived from the three-dimensional layout are detected. The contours have interface spots/locations (e.g., corners where the walls meet) which correspond to a plurality of rectangular parallelepipeds. Based on the rectangular parallelepipeds, a set of wall edges (e.g., corresponding to one face of a rectangular parallelepiped) is resolved which is interrelated with the contours. Based on the set of wall edges, a group of geometric objects which represent walls/rooms (e.g., polytopes representing walls/rooms) is determined. The group of geometric objects can then be used to establish a design-model for constructing a heating, ventilation, and air conditioning (HVAC) system. As such, the design-model may be used to select an HVAC system with performance or efficiency benefits (e.g., with respect to energy distribution).

Figure 6:
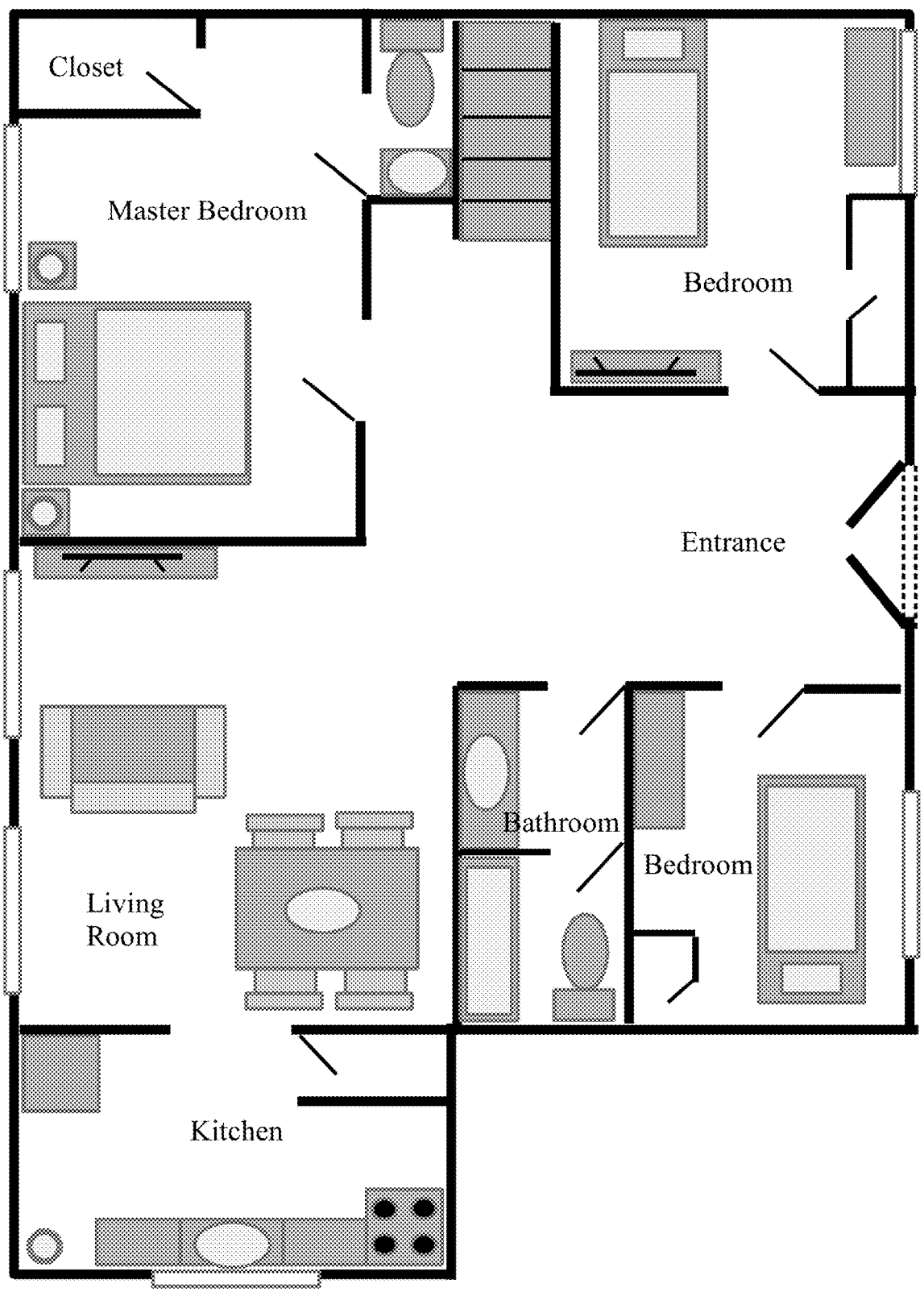
FIG. 6 depicts an example architectural layout of a building, according to embodiments.

FIG. 6 is an example architectural layout 600 of a building according to embodiments. The example architectural layout 600 can include architectural segments which represent architectural features.

Figure 7:
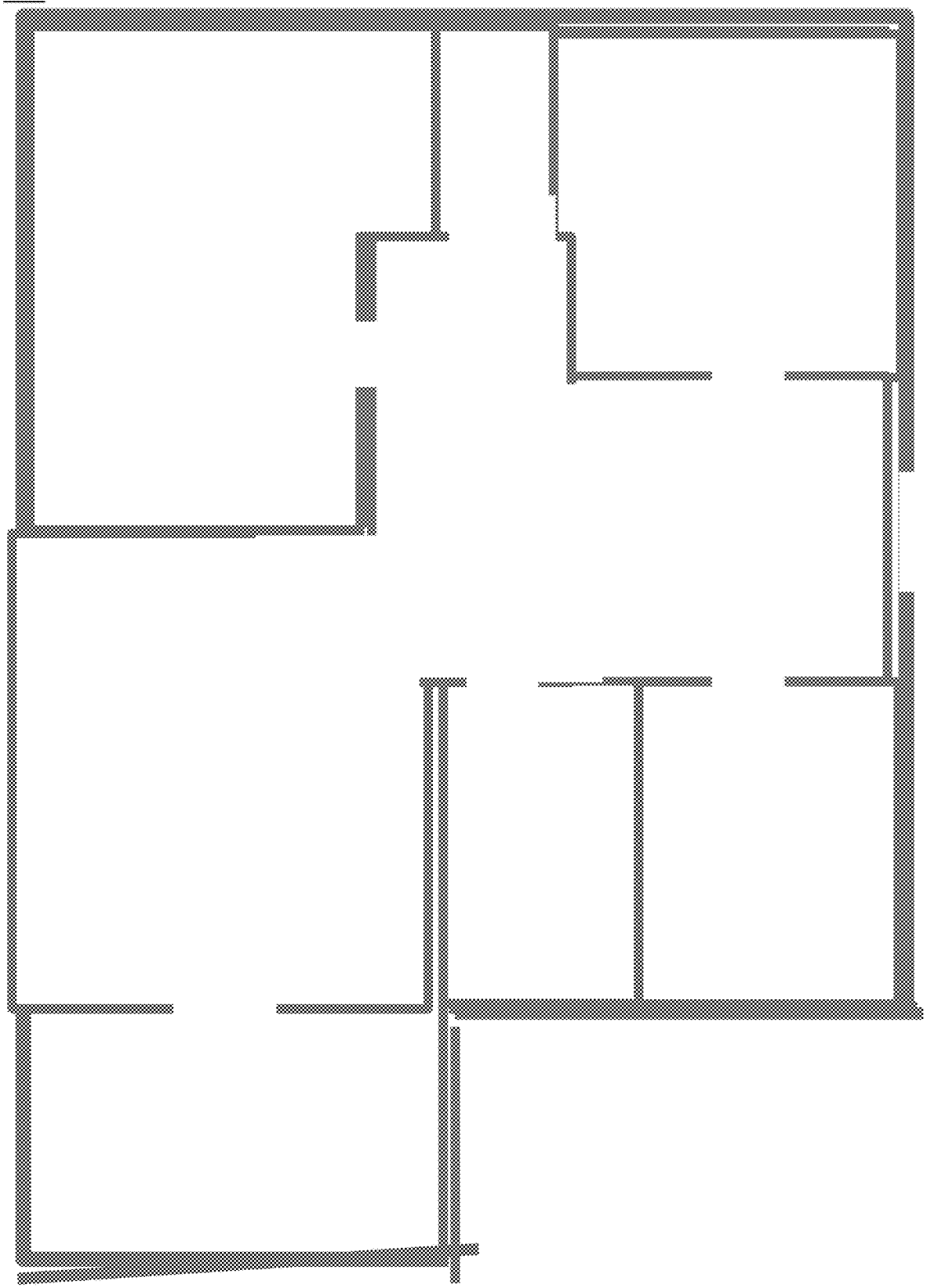
FIG. 7 depicts an example architectural layout of a building, according to embodiments.

FIG. 7 is an example architectural layout 700 of a building according to embodiments. The example architectural layout 700 may be based on (e.g., derived from) the example architectural layout 600. The example architectural layout 700 may have junctures or wall segments. The example architectural layout 700 may have a variety of imperfections, flaws, errors, or the like. Such flaws may lead to challenges in developing, for examples, spatial zones or a design-model if the flaws are not addressed using aspects/methodologies such as those described herein.

Figure 8:
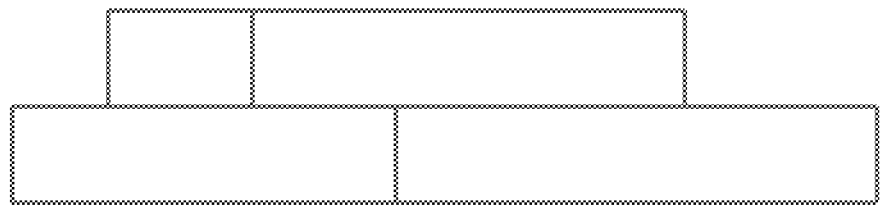
FIG. 8 depicts both an example set of input simple/single walls and an example set of resulting multi-walls according to embodiments.
Figure 8:
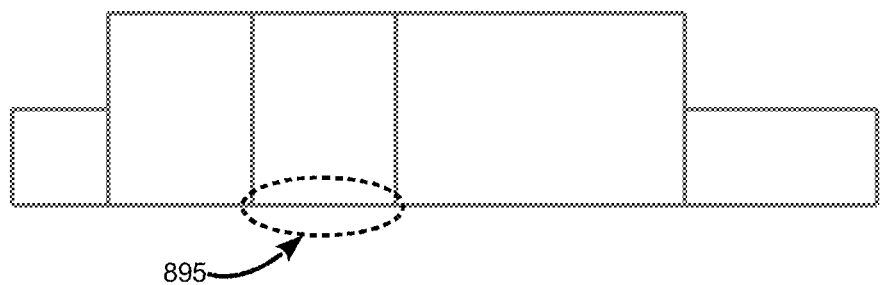

FIG. 8 includes both an example set of input simple/single walls 800 and an example set of resulting multi-walls 850 according to embodiments. The example set of input simple/single walls 800 may be clustered together (e.g., adjacency). As described herein, the example set of resulting multi-walls 850 may have one or more portions of simple/single walls. Segment 895 (depicted/called-out inside of the dotted ellipse) may be an example curve/arc/line segment which is part of the multi-wall perimeter. As such, segment 895 can be used when determining boundaries such as room boundaries.

Figure 9:
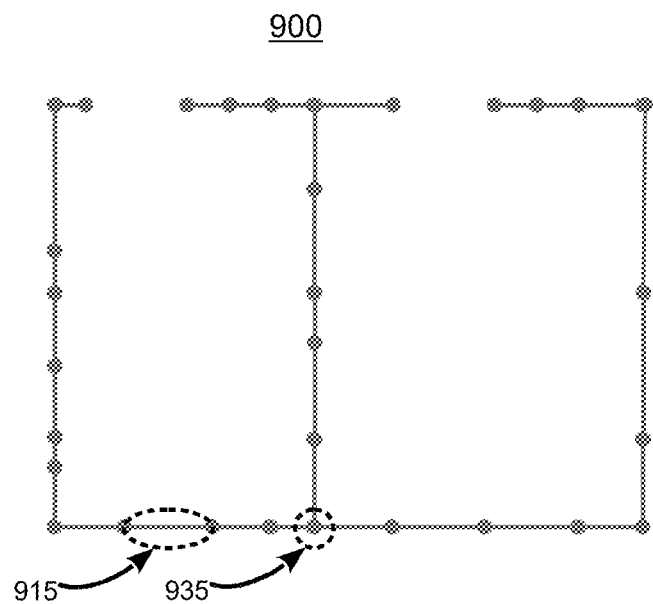
FIG. 9 depicts both an example set of segments and an example set of junctures, and an example set of contours according to embodiments.
Figure 9:
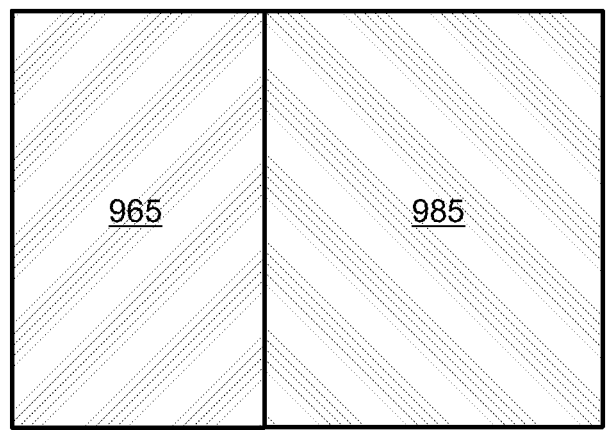

FIG. 9 includes both an example set of segments and an example set of junctures 900, and an example set of contours 950 according to embodiments. For example, example segment 915 (depicted/called-out inside of the dotted ellipse) may be an example curve/arc/line segment (e.g., which was derived from a part of a multi-wall perimeter). Example juncture 935 (depicted/called-out inside of the dotted circle) may be an example of a spatial interface relationship (e.g., intersection, joint) of a plurality of segments.

Based on the segments and junctures (e.g., stepping along segment-paths), a first contour 965 (the rectangle on the left depicted with its interior area shaded) and a second contour 985 (the rectangle on the right with depicted with its interior area shaded) may be determined/formed. For illustrative clarity, junctures are not depicted in the example set of contours 950; in embodiments, the junctures are included in the example set of contours. In embodiments, the first contour 965 may form the basis of a first potential room candidate and the second contour 985 may form the basis of a second potential room candidate.

Figure 10:
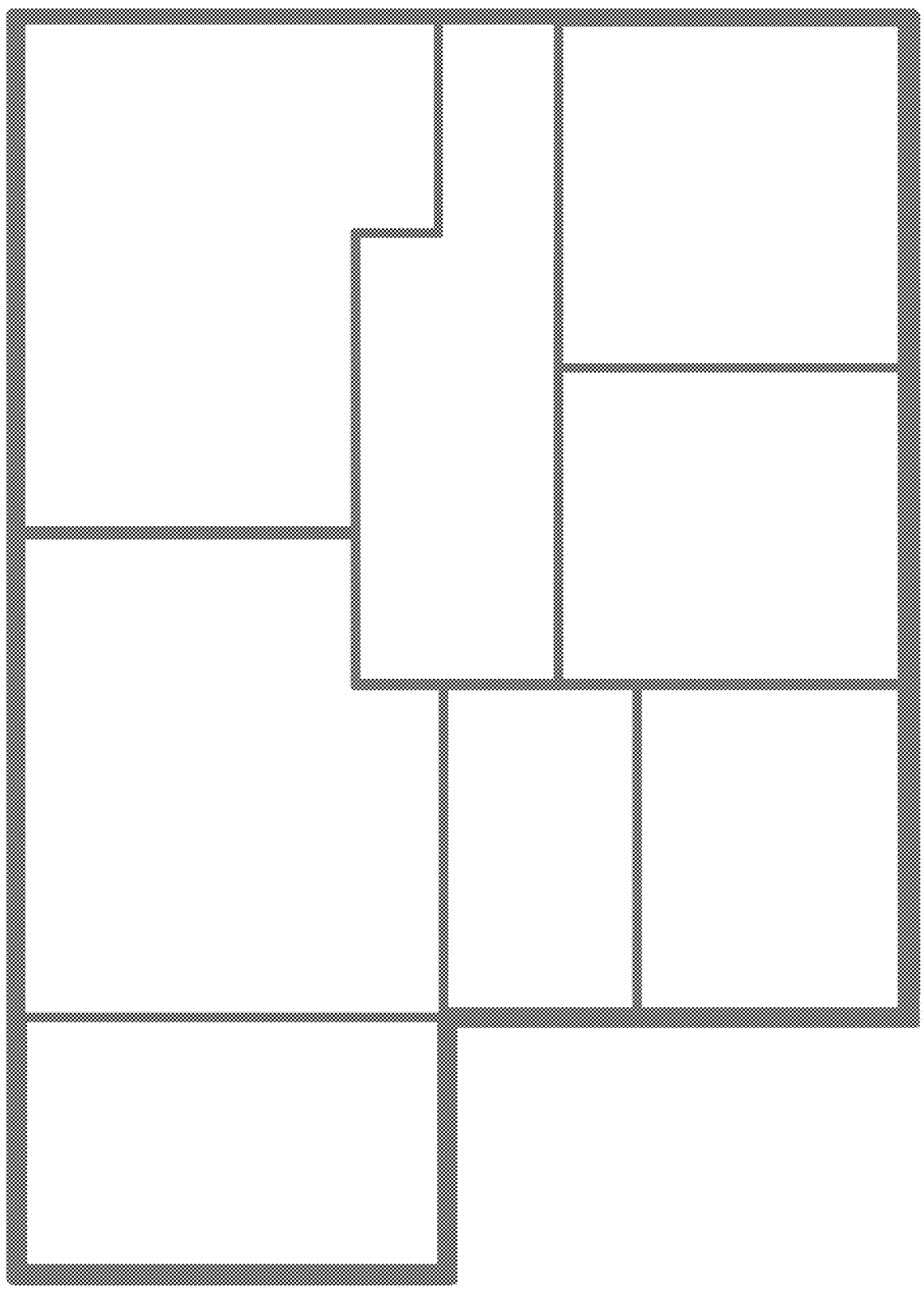
FIG. 10 is an example diagram associated with an architectural layout of a building according to embodiments.

FIG. 10 is an example diagram 1000 associated with an architectural layout of a building according to embodiments. The example diagram 1000 may be a set of candidate spatial zones or example group of geometric objects correlated to a set of spatial zones. The example diagram 1000 may illustrate aspects/methodologies/operations described herein and applied to the example architectural layout 600 of FIG. 6. As such, flaws with respect to the example architectural layout 600 may be accounted for or neutralized in the example diagram 1000. Accordingly, a design-model of the example architectural layout may be established using the example diagram 1000.

Figure 11:
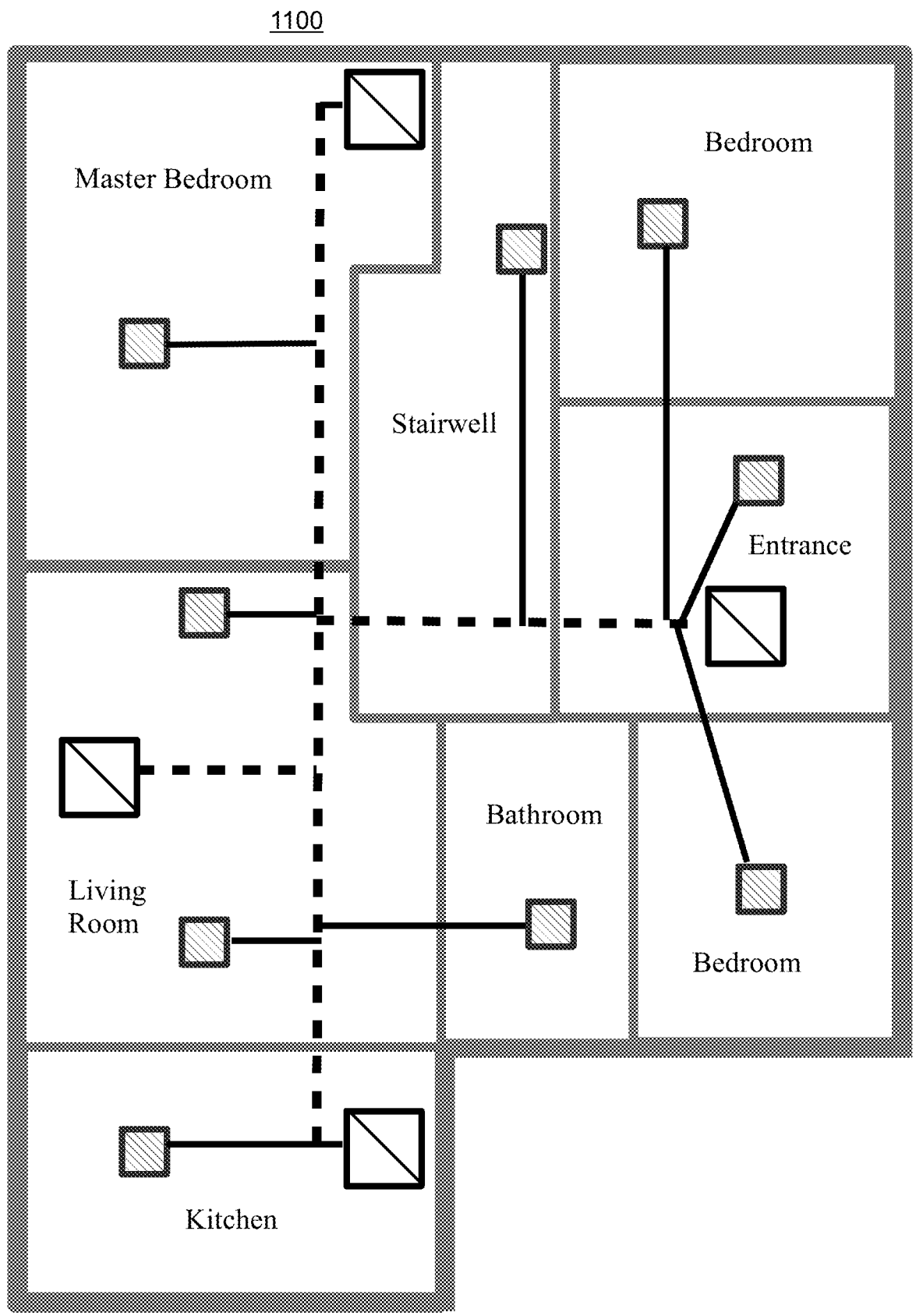
FIG. 11 depicts an example architectural layout of a building, according to embodiments.

FIG. 11 depicts an example architectural layout 1100 of a building, consistent with embodiments. The example architectural layout may include an example design-model for the building. As described herein, establishing the design-model may include generating a thermal-system design to manage the thermal load of the building. Accordingly, the example design-model may include an example thermal system infrastructure of heating, ventilation, cooling and air conditioning equipment designed to manage the thermal load of the building. In certain embodiments, establishing the design-model may be based in part on an exterior wall architectural object. The exterior wall architectural object may be included in the set of architectural objects, and may represent at least a portion of an exterior wall of the architectural layout. Generally, the exterior wall architectural object may include a wall or vertical structure having at least one surface that is outside of the building. The exterior wall architectural object may be associated with a set of exterior wall data that indicates properties such as the insulation characteristics, thickness, structural attributes, degree of flammability, degree of permeability (e.g., to air, water) and the like. In embodiments, the exterior wall data may be used to generate the thermal-system design and establish the design-model for the architectural layout.

Figure 12:
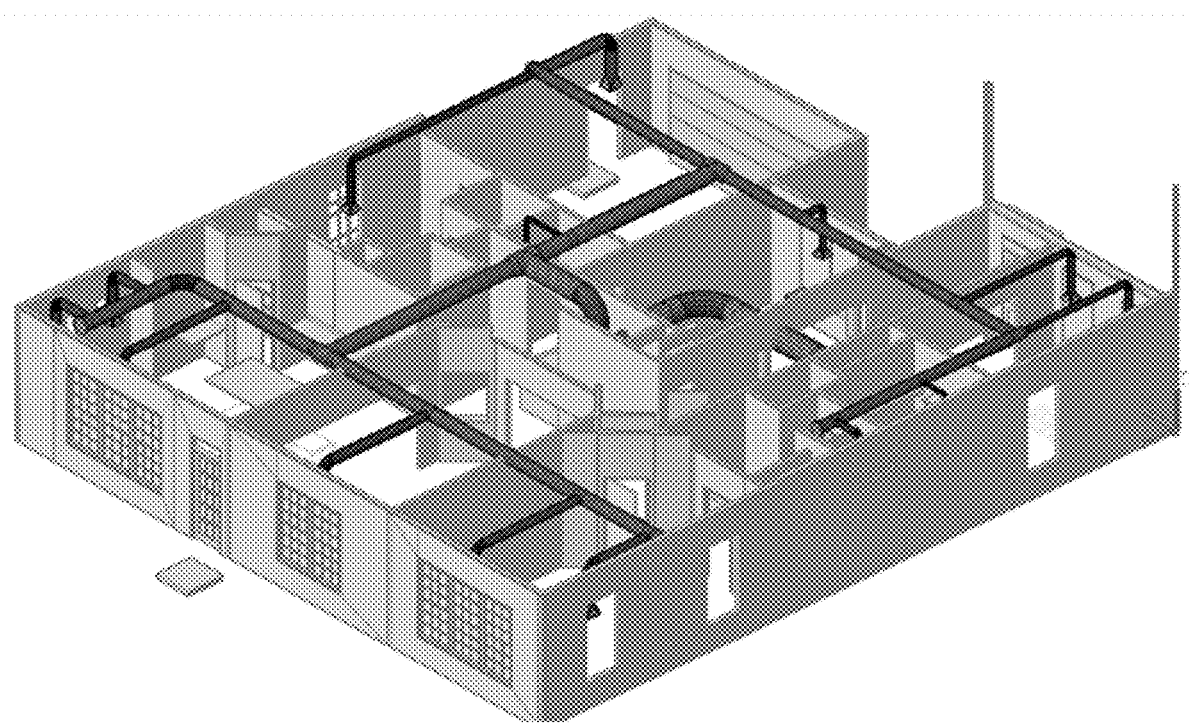
FIG. 12 depicts an example three-dimensional design-model, according to embodiments.

FIG. 12 depicts an example three-dimensional design-model 1200, consistent with embodiments. As described herein, establishing the design-model may include generating a thermal-system design to manage the thermal load of the building. Accordingly, the design-model 1200 includes an example thermal system infrastructure of heating, ventilation, cooling and air conditioning equipment (e.g., duct system objects) designed to manage the thermal load of the building. FIG. 12 may depict the design-model 1200 in a first view, displaying the thermal-system infrastructure and surrounding structural components.

Figure 13:
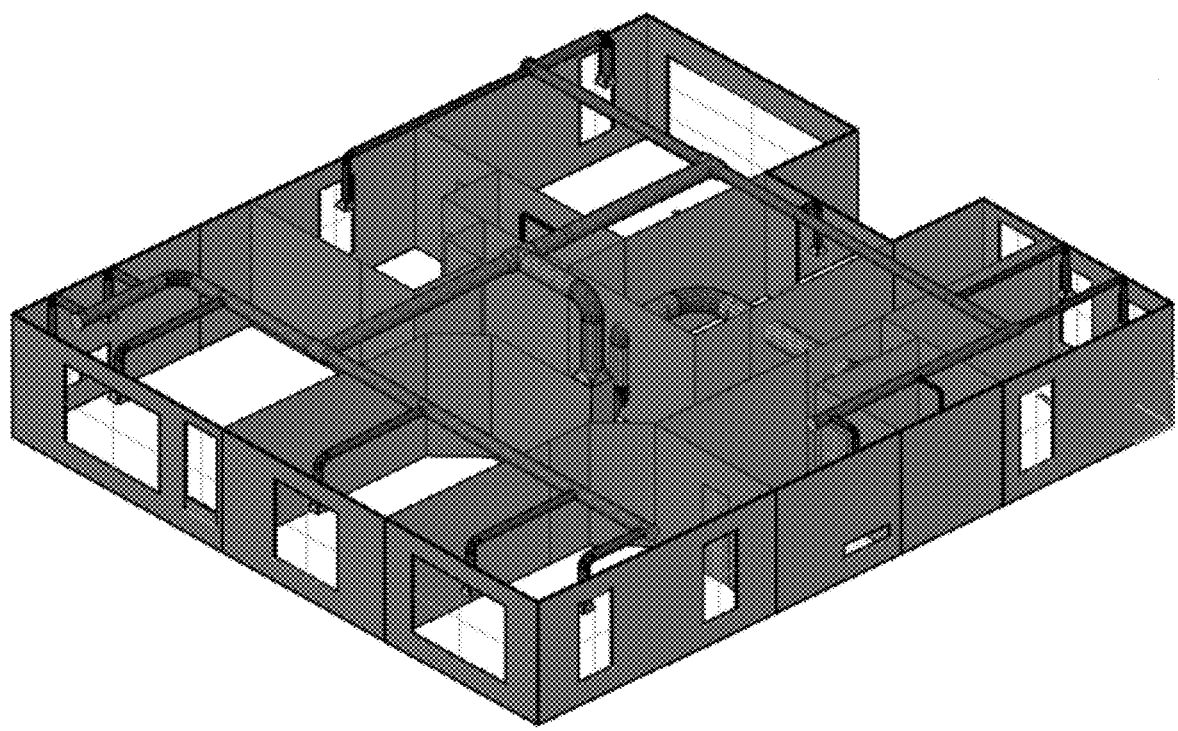
FIG. 13 depicts an example three-dimensional design-model, according to embodiments.

FIG. 13 depicts an example three-dimensional design model 1300, consistent with embodiments. FIG. 13 may depict the design model 1300 in a second view, displaying the thermal-system infrastructure, surrounding structural components, and architectural objects (e.g., rooms, windows, and doors) of the building. The thermal-system design may be used to model the heat flow and energy distribution of the building. Other thermal-design systems and methods of managing heat flow and energy distribution are also possible.

Figure 14:
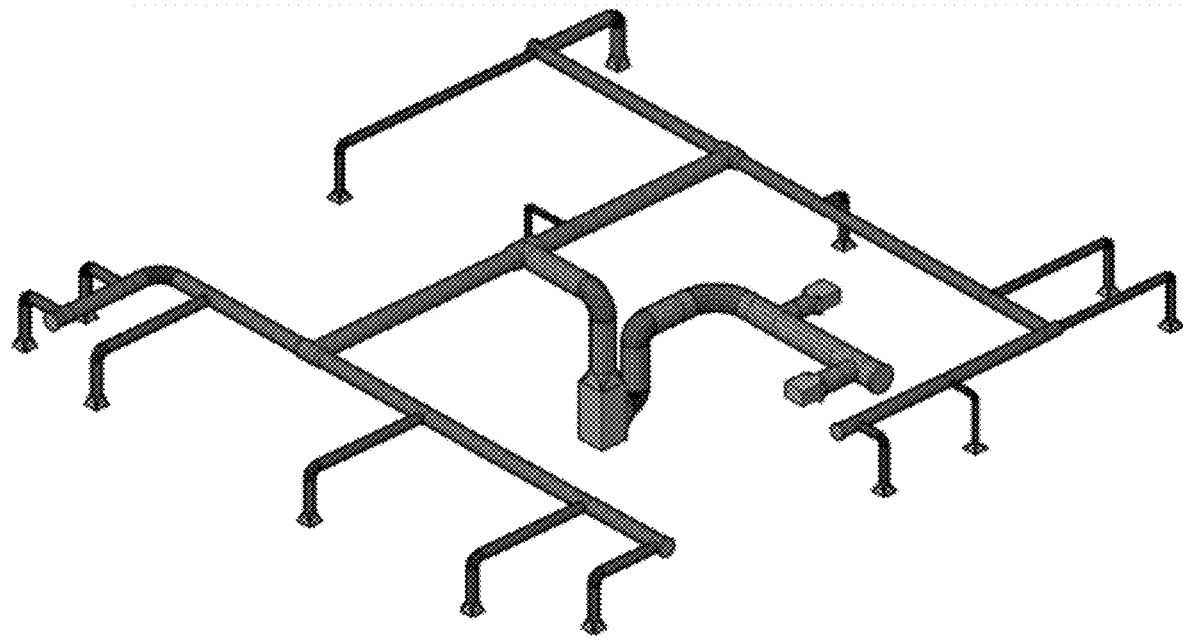
FIG. 14 depicts an example thermal-system design, according to embodiments.

FIG. 14 depicts an example thermal-system design 1400, consistent with embodiments. The thermal-system design 1400 may have an isolated view of the duct system objects and other heating, ventilation, cooling, and air conditioning equipment used in the first view of the three-dimensional design model 1200 and the second view of the three-dimensional design model 1300.

In addition to embodiments described above, other embodiments having fewer operational steps, more operational steps, or different operational steps are contemplated. Also, some embodiments may perform some or all of the above operational steps in a different order. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud-computing resources are provided to a user on a pay-per-use basis, where users are charged only for the computing resources actually used (e.g., an amount of storage space used by a user or a number of virtualized systems instantiated by the user). A user can access any of the resources that reside in the cloud at any time, and from anywhere across the Internet. In context of the present disclosure, a user may access applications or related data available in the cloud. For example, the nodes used to create a stream computing application may be virtual machines hosted by a cloud service provider. Doing so allows a user to access this information from any computing system attached to a network connected to the cloud (e.g., the Internet).

Embodiments of the present disclosure may also be delivered as part of a service engagement with a client corporation, nonprofit organization, government entity, internal organizational structure, or the like. These embodiments may include configuring a computer system to perform, and deploying software, hardware, and web services that implement, some or all of the methods described herein. These embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer-implemented method comprising:
   detecting, in a data source, a cluster of architectural segments;
   populating an architectural layout with the cluster of architectural segments from the data source, wherein the cluster of architectural segments represent one or more architectural features of the architectural layout, wherein the one or more architectural features include first and second wall segments each representing at least a portion of a wall of the architectural layout, and wherein the first wall segment has both a threshold-proximity relationship and a threshold-parallel relationship with respect to the second wall segment, the threshold-proximity relationship identifying when the first and second wall segments are proximate each other relative to a scale of the architectural layout and the threshold-parallel relationship identifying when the first and second wall segments are relatively parallel to each other;
   executing, by a design-model management application of a host device, a junctures operation to identify a set of junctures among the one or more architectural features of the architectural layout based on the cluster of architectural segments, wherein one or more junctures of the set of junctures indicate a spatial interface relationship, wherein the spatial interface relationship includes at least one of a group consisting of: an intersection, a joint, or a neighborhood junction having a threshold tolerance dimension, the threshold tolerance dimension comprising a predetermined separation distance within about 5% or less of a size of the architectural layout;
   executing, by the design-model management application of the host device, a contours operation to determine a set of contours among the one or more architectural features of the architectural layout using the set of junctures, wherein one or more contours of the set of contours have a plurality of junctures including a start-finish juncture; and
   executing, by the design-model management application of the host device, a candidate spatial zones operation to generate a set of candidate spatial zones associated with the architectural layout based on the set of contours, wherein generating the set of candidate spatial zones includes generating a set of candidate polytopes.

2. The method of claim 1, wherein identifying the set of junctures includes:
   determining a set of geometric unions based on the cluster of architectural segments, wherein one or more geometric unions of the set of geometric unions have both a first portion of a first wall segment and a second portion of a second wall segment; and
   determining, based on the set of geometric unions, the set of junctures.

3. The method of claim 2, wherein determining the set of junctures includes:
   determining a set of geometric segments based on the set of geometric unions, wherein one or more geometric segments of the set of geometric segments use a boundary of at least a portion of the set of geometric unions; and
   determining, based on the set of geometric segments, the set of junctures.

4. The method of claim 1, wherein the start-finish juncture has one location where one contour both begins and ends.

5. The method of claim 1, wherein determining the set of contours includes:

processing a segment-path to ascertain an individual contour, including:
    stepping, along the segment-path, from a first juncture to a second juncture which is separate from the first juncture,
    stepping, along the segment-path, from the second juncture to a third juncture which is separate from the first and second junctures, and
    stepping, along the segment-path, to the first juncture from a juncture other than the second juncture; and
computing, in response to processing the segment-path, an individual polytope for the individual contour.

6. The method of claim 1, wherein determining the set of contours includes normalizing the set of contours.

7. The method of claim 6, wherein normalizing the set of contours includes at least one of a group consisting of: deleting a redundant piece, removing an appended piece, adding an implied piece, or repairing a disconnected piece.

8. The method of claim 1, wherein determining the set of contours includes:
    adding a new contour-portion which forms one or more new junctures.

9. The method of claim 1, wherein managing the set of candidate spatial zones associated with the architectural layout includes extracting the set of candidate spatial zones from the architectural layout.

10. The method of claim 1, further comprising establishing, using the set of candidate spatial zones, a design-model of the architectural layout.

11. The method of claim 10, wherein the data source includes an architectural graphical representation, and wherein the design-model includes a heating, ventilation, and air conditioning (HVAC) design-model.

12. The method of claim 1, further comprising:
    metering use of the management of the set of candidate spatial zones associated with the architectural layout; and
    generating an invoice based on the metered use.

13. A system comprising:
    a memory having a set of computer readable computer instructions, and
    a processor for executing the set of computer readable instructions, the set of computer readable instructions including:
        detecting, in a data source, a cluster of architectural segments;
        populating an architectural layout with the cluster of architectural segments from the data source, wherein the cluster of architectural segments represent one or more architectural features of the architectural layout, wherein the one or more architectural features include first and second wall segments each representing at least a portion of a wall of the architectural layout, and wherein the first wall segment has both a threshold-proximity relationship and a threshold-parallel relationship with respect to the second wall segment, the threshold-proximity relationship identifying when the first and second wall segments are proximate each other relative to a scale of the architectural layout and the threshold-parallel relationship identifying when the first and second wall segments are relatively parallel to each other;
        executing a junctures operation to identify a set of junctures among the one or more architectural features of the architectural layout based on the cluster of architectural segments, wherein one or more junctures of the set of junctures indicate a spatial interface relationship, wherein the spatial interface relationship includes at least one of a group consisting of: an intersection, a joint, or a neighborhood junction having a threshold tolerance dimension, the threshold tolerance dimension comprising a predetermined separation distance within about 5% or less of a size of the architectural layout;
        executing a contours operation to determine a set of contours among the one or more architectural features of the architectural layout using the set of junctures, wherein one or more contours of the set of contours have a plurality of junctures including a start-finish juncture; and
        executing a candidate spatial zones operation to generate a set of candidate spatial zones associated with the architectural layout based on the set of contours, wherein generating the set of candidate spatial zones includes generating a set of candidate polytopes.

14. A computer program product comprising a computer readable storage medium having program instructions embodied therewith, wherein the computer readable storage medium is not a transitory signal per se, the program instructions executable by a processor to cause the processor to perform a method comprising:
    detecting, in a data source, a cluster of architectural segments;
    populating an architectural layout with the cluster of architectural segments from the data source, wherein the cluster of architectural segments represent one or more architectural features of the architectural layout, wherein the one or more architectural features include first and second wall segments each representing at least a portion of a wall of the architectural layout, and wherein the first wall segment has both a threshold-proximity relationship and a threshold-parallel relationship with respect to the second wall segment, the threshold-proximity relationship identifying when the first and second wall segments are proximate each other relative to a scale of the architectural layout and the threshold-parallel relationship identifying when the first and second wall segments are relatively parallel to each other;
    executing a junctures operation to identify a set of junctures among the one or more architectural features of the architectural layout based on the cluster of architectural segments, wherein one or more junctures of the set of junctures indicate a spatial interface relationship, wherein the spatial interface relationship includes at least one of a group consisting of: an intersection, a joint, or a neighborhood junction having a threshold tolerance dimension, the threshold tolerance dimension comprising a predetermined separation distance within about 5% or less of a size of the architectural layout;
    executing a contours operation to determine a set of contours among the one or more architectural features of the architectural layout using the set of junctures, wherein one or more contours of the set of contours have a plurality of junctures including a start-finish juncture; and
    executing a candidate spatial zones operation to generate a set of candidate spatial zones associated with the architectural layout based on the set of contours, wherein generating the set of candidate spatial zones includes generating a set of candidate polytopes.

15. The computer program product of claim 14, wherein the program instructions are stored in the computer readable storage medium in a data processing system, and wherein the program instructions were downloaded over a network from a remote data processing system.

16. The computer program product of claim 14, wherein the program instructions are stored in the computer readable storage medium in a server data processing system, and wherein the program instructions are downloaded over a network to the remote data processing system for use in a second computer readable storage medium with the remote data processing system.

\* \* \* \* \*